(12) United States Patent
Herdt

(10) Patent No.: US 6,512,694 B2
(45) Date of Patent: Jan. 28, 2003

(54) NAND STACK EEPROM WITH RANDOM PROGRAMMING CAPABILITY

(75) Inventor: Christian E. Herdt, Westborough, MA (US)

(73) Assignee: Simtek Corporation, Colorado Springs, CO (US)

(*) Notice: Subject to any disclaimer, the term of this patent is extended or adjusted under 35 U.S.C. 154(b) by 0 days.

(21) Appl. No.: 09/681,314

(22) Filed: Mar. 16, 2001

(65) Prior Publication Data

US 2002/0131302 A1 Sep. 19, 2002

(51) Int. Cl.[7] .............................................. G11C 16/04
(52) U.S. Cl. ............................ 365/185.17; 365/185.18; 365/185.28
(58) Field of Search ...................... 365/185.17, 185.18, 365/185.28, 185.01

(56) References Cited

U.S. PATENT DOCUMENTS

| | | | |
|---|---|---|---|
| 4,142,176 A | 2/1979 | Dozier | 340/166 |
| 4,959,812 A | 9/1990 | Momodomi et al. | 365/185 |
| 5,008,856 A | 4/1991 | Iwahashi | 365/185 |
| 5,440,509 A | * 8/1995 | Momodomi et al. | 365/185.13 |
| 5,546,341 A | 8/1996 | Suh et al. | 365/185.33 |
| 5,723,888 A | 3/1998 | Yu | 257/319 |
| 5,798,547 A | 8/1998 | Urai | 257/316 |
| 5,892,712 A | 4/1999 | Hirose et al. | 365/185.07 |
| 6,009,014 A | * 12/1999 | Holmer et al. | 365/185.22 |
| 6,058,046 A | * 5/2000 | Imamiya et al. | 365/185.3 |
| 6,163,048 A | 12/2000 | Hirose et al. | 257/315 |

OTHER PUBLICATIONS

Herdt, Christian E. and Paz de Araujo, Carlos A., "Analysis, Measurement, and Simulation of Dynamic Write Inhibit in an nySRAM Cell", 1992, IEEE.

* cited by examiner

Primary Examiner—Hoai Ho
(74) Attorney, Agent, or Firm—Holland & Hart LLP; Christopher J. Kulish, Esq.

(57) ABSTRACT

The invention relates to a NAND stack EEPROM that with random programming capability. In one embodiment, dynamic program inhibit is used to achieve random programming the memory cells within a NAND stack.

5 Claims, 3 Drawing Sheets

NAND STACK EEPROM WITH RANDOM PROGRAMMING CAPABILITY

FIELD OF THE INVENTION

The present invention relates to a electrically erasable programmable read-only memory (EEPROM) and, more specifically, to a NAND stack EEPROM.

BACKGROUND OF THE INVENTION

In general, a computer system is comprised of a memory for holding data and programs, a processor for executing the programs or operating on the data held in memory, and an input/output device for facilitating communications between the computer system and a user. There are several different types of digital memories available for use in the memory portion of a computer system. In many instances, the particular application in which the computer system is intended to be used dictates the type of memory that is appropriate for all or a portion of the memory of the computer system. For instance, one application for a computer system in which a NAND stack EEPROM may be appropriate is in a portable computer system. Portable computer systems are generally designed to operate, if needed, with power supplied by a battery housed within the system. If the battery becomes incapable of providing power to the system and an alternative source of power is not available, the data held in memory could become irretrievably lost. In such applications, it may be desirable to employ a EEPROM memory because an EEPROM is capable of retaining data even when power is not being provided.

A typical EEPROM memory device is comprised of: (1) a plurality of EEPROM memory cells; (2) an input/output structure for transferring data between the memory cells and the exterior environment and receiving commands relating to such transfers; and (3) a controller that, in response to commands, causes data to be transferred between the memory cells and the exterior environment via the input/output structure. More recently, "NAND" type EEPROMs have evolved in which a plurality of EEPROM memory cells are connected in series to form a "stack." One end of the stack is connected to a bit line that is used to transfer bits of data between each of the EEPROM memory cells in the stack and the exterior environment. The other end of the stack is connected to ground. The advantage of the NAND stack EEPROM is that, relative to EEPROMs that do not employ a stack, greater memory density can be achieved, i.e., there are a greater number of EEPROM memory cells per unit area. Additionally, NAND stack EEPROMs also are less expensive to manufacture than EEPROMs that do no employ the stack architecture.

However, a drawback associated with many NAND stack EEPROM devices is that bits must be programmed or written into the memory cells in the stack in sequence, i.e., the memory cell closest to ground must be programmed first, then the memory cell next closest to ground is programmed and so on until the memory cell furthest from ground is programmed. Similarly, the bits in the memory cells in the stack must be read in the reverse order in which they were programmed. In programming a bit into a particular memory cell in the stack, it is necessary, while the programming is occurring, to prevent the bits in the other memory cells in the stack from being disturbed or altered. Many of the NAND stack EEPROMs prevent these bits from being disturbed by utilizing a static program inhibit technique that forces a voltage on the silicon surface adjacent a cell that is about equal to the voltage on the gate of the field-effect transistor that constitutes the memory cell. As a consequence, the potential drop across the dielectric of the transistor is insufficient to produce the tunneling of charge that would otherwise program the transistor.

SUMMARY OF THE INVENTION

The present invention provides a NAND stack EEPROM that allows the memory cells within the stack to be programmed in any order. For example, in a NAND stack EEPROM that has two, series-connected, memory cells with the first memory cell located closer to ground than the second memory cell, a bit can be programmed into the second memory cell before a bit is programmed into the first memory cell or visa versa. In other words, the present invention provides a NAND stack EEPROM that is capable of random programming of the memory cells in the stack.

Random programming of the memory cells in the stack is achieved in one embodiment by utilizing a dynamic program inhibit rather than the previously noted static program inhibit. In dynamic program inhibit, the silicon surface of the EEPROM is disconnected from all sources of charge such that the surface can then couple up with the gate of the field-effect transistor that constitutes a memory cell. This coupling, in turn, produces a potential drop across the dielectric of the EEPROM that is insufficient to cause the tunneling of charge that would program the transistor. It should be appreciated that dynamic program inhibit is a dynamic or transitory phenomena that only exists for relatively short period of time. Consequently, any programming must be completed while the dynamic program inhibit is in effect. In contrast, static program inhibit lasts until the voltage on the silicon surface is removed.

A NAND stack EEPROM with dynamic program inhibit capability has number of advantages relative to a NAND stack EEPROM with static program inhibit. Namely, a NAND stack EEPROM with dynamic program inhibit has the advantages of: (1) allowing random programming of the series-connected memory cells in a stack; (2) reducing the number of nodes within the stack to which high voltage must be applied; and (3) allowing the spacing between circuit elements to be reduced, thereby permitting a greater density of memory cells for a given area.

DETAILED DESCRIPTION

Figure 1:
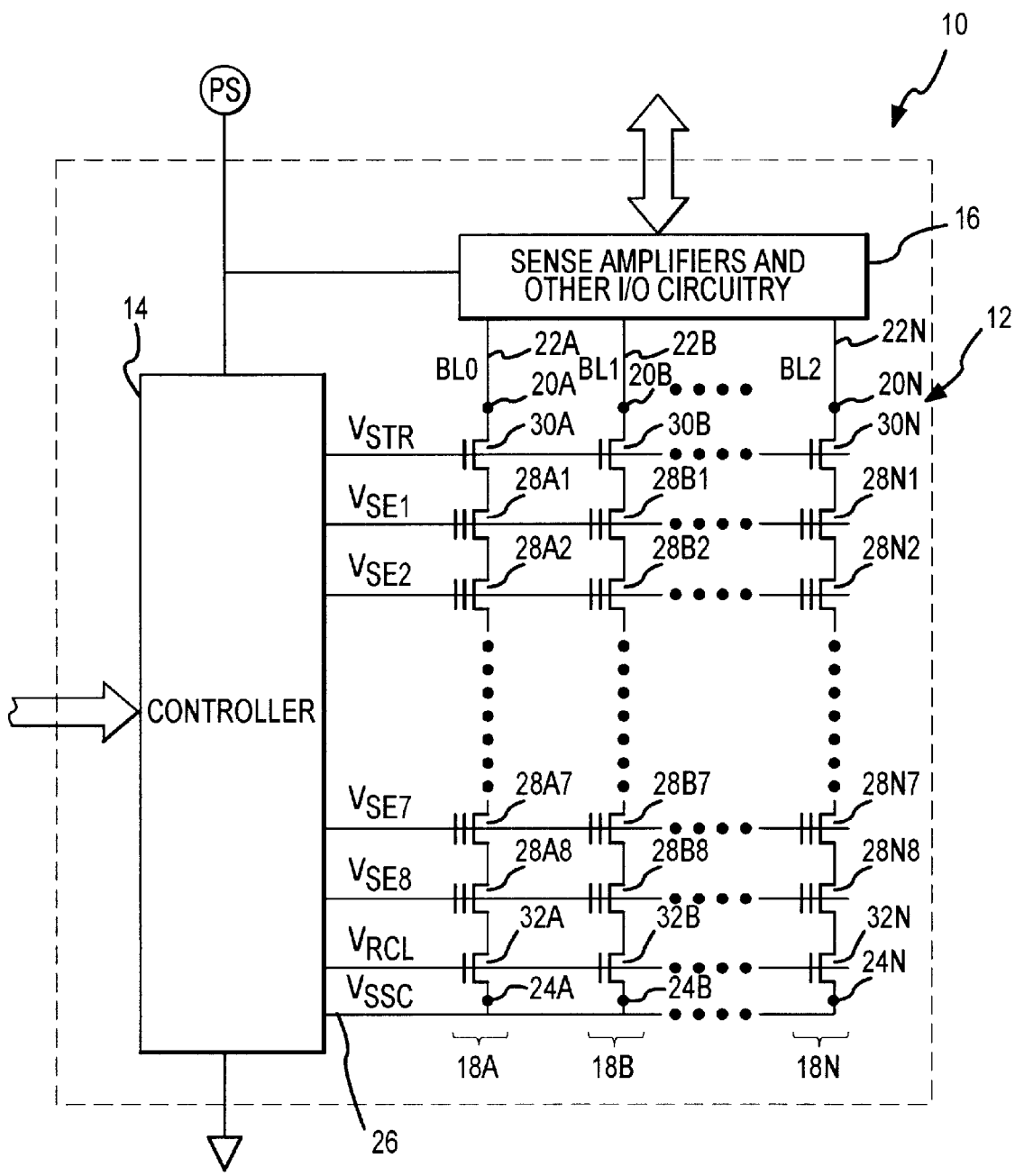
FIG. 1 illustrates a NAND stack EEPROM device that includes: (a) a plurality of NAND stacks with each stack having eight non-volatile memory cells; and (b) a controller for managing the transfer of data to and from the stacks.

FIG. 1 illustrates a NAND stack EEPROM with random programming capability 10, hereinafter EEPROM 10. Generally, the EEPROM 10 includes a memory array 12 for storing bits of data received from the exterior environment, a controller 14 for processing commands from a microprocessor or similar device relating to data to be transferred between the memory array 12 and the exterior environment, and input/output circuitry 16 for receiving bits of data from that exterior environment that are to be stored in the memory array 12 and providing bits of data that have been stored in the memory array 12 to the exterior environment. While the memory array 12, controller 14, and input/output circuitry 16 are shown as being integrated onto a single semiconductor chip it should be appreciated that all or part of each of these elements could be located on a separate chip or chips.

The memory array 12 is comprised of a plurality of memory stacks 18A–18N. Each of the memory stacks 18A–18N includes a first end 20A–20N that is connected to a bit line 22A–22N and a second end 24A–24N that is connected to a reference line or ground 26. Located between the first and second ends of each the memory stacks are eight, series-connected, non-volatile memory devices 28A1–28A8, 28B1–28B8 and 28N1–28N8. While each stack includes eight non-volatile memory devices, it should be appreciated that a stack includes at least two, non-volatile memory devices and may have eight or more, non-volatile memory devices. In the illustrated embodiment, the non-volatile memory devices are silicon nitride oxide semiconductor, n-channel, field-effect transistors, i.e., SNOS FETs. It should be appreciated that while n-channel FETs are utilized in the illustrated embodiment, with appropriate modifications, p-channel devices can also be utilized. Further, several other types of non-volatile memory devices that have adjustable thresholds are also feasible, including silicon oxide nitride oxide semiconductor transistors (SONOS), floating gate transistors and ferroelectric transistors. The gates of the first non-volatile memory device 28A1–28N1 in each of the stacks 18A–18N is connected to the controller 14 by a $V_{SE1}$ line. Likewise, the gates of the second through eighth corresponding non-volatile memory devices in each of the stacks are respectively connected to the controller via $V_{SE2}$–$V_{SE8}$ lines.

Each of the memory stacks includes a first switching device 30A–30N located between the bit lines 22A–22N and the first non-volatile memory devices 28A1–28N1 for operatively connecting and disconnecting a stack from its associated bit line. In the illustrated embodiment, each of the first switching devices is an n-channel, field-effect transistor. It should be appreciated that with appropriate modifications, p-channel FETS, bipolar transistors and combinations of different types of transistors can be utilized. The gate of each of the first switching devices 30A–30N is connected to the controller via a $V_{STR}$ line.

Each of the memory stacks further includes a second switching device 32A–32N located between the second ends 24A–24N and the eighth non-volatile memory devices 28A8–28N8 for operatively connecting and disconnecting a stack from ground 26. In the illustrated embodiment, n-channel FETs are utilized but other types of transistors and combinations can also be used, as noted with respect to the first switching devices. The gate of each of the second switching devices 32A–32N is connected to the controller via $V_{RCL}$ line.

Figure 2:
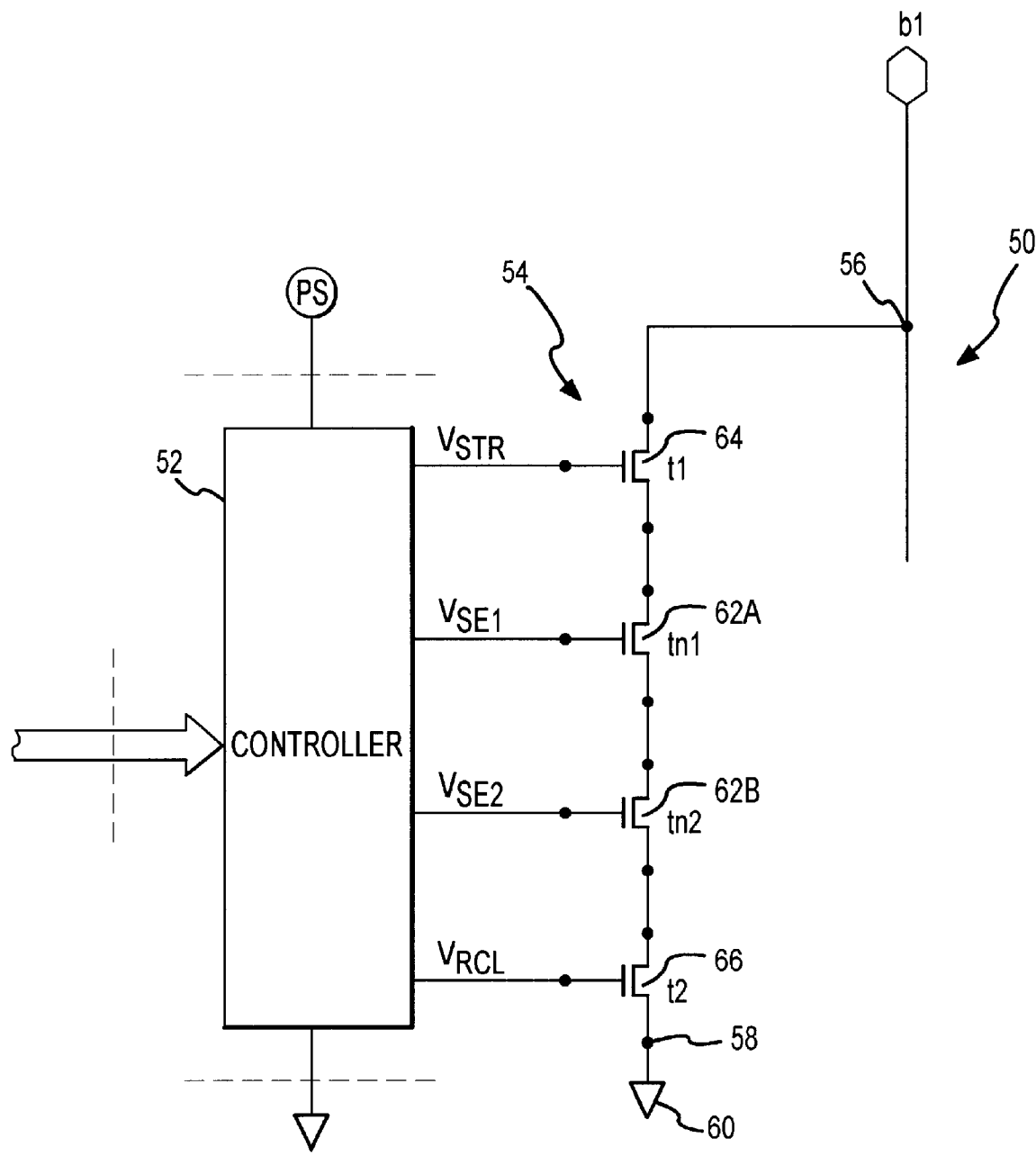
FIG. 2 illustrates a NAND stack EEPROM device that includes a single stack with two, series-connected, memory cells and a controller for managing the transfer of bits of data between the stack and the exterior environment.

In operation, the controller 14 manages the $V_{STR}$, $V_{RCL}$ and $V_{SE1}$–$V_{SE8}$ lines so that non-volatile memory devices in each of the stacks 18A–18N can be programmed in any order, i.e., in random order. For example, the second non-volatile memory devices 28A2–28N2 can be programmed before the seventh non-volatile memory devices 28A7–28N7. To simplify the description of the operation, the random programming capability is described with respect to a NAND stack EEPROM 50 (FIG. 2) that includes a controller 52 and single stack 54 with a first end 56 and a second end 58. Located between the first end 56 and the second end 58 are two, non-volatile memory devices 62A and 62B, a first switching device 64 and a second switching device 66. A bit line (bl) is operatively connected to the to the first end 56 of the stack 54. The second end 58 of the stack is connected to a ground 60. The two, non-volatile memory devices 62A and 62B are respectively connected to the controller 52 by $V_{SE1}$ and $V_{SE2}$ lines. The first switching device 64 and second switching device 66 are respectively connected to the controller 52 via $V_{STR}$ and $V_{RCL}$ lines. The sense amplifier and other I/O circuitry are not shown.

Figure 3:
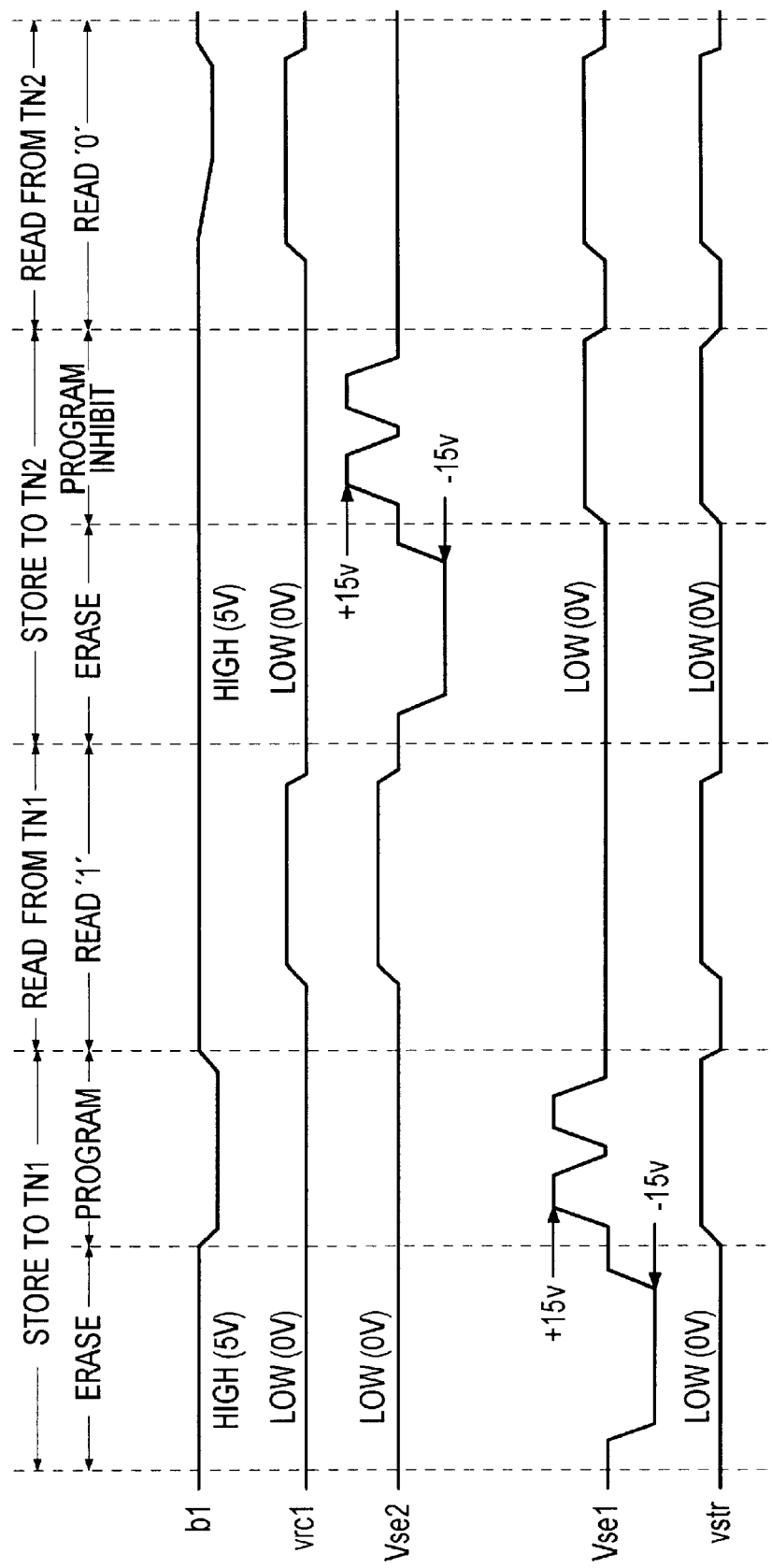
FIG. 3 is a timing diagram of the store and read operations for each of the two, series-connected, non-volatile memory cells in the stack of the NAND stack EEPROM shown in FIG. 2.

FIG. 3 illustrates each of the following operations associated with the EEPROM 50: (1) a store operation to the first non-volatile memory cell 62A (tn1); a store operation to the second non-volatile memory cell 62B (tn2); (3) a read operation from the first non-volatile memory cell 62A; and (4) a read operation from the second non-volatile memory cell 62B. While FIG. 3 shows the store and read operations occurring in a particular sequence, these operations could occur in any sequence, i.e., could occur in a random sequence. It should be particularly appreciated, however, that the store operations could occur in a random sequence.

Initially, the store operation with respect to the first non-volatile memory cell 62A is described. The store operation typically occurs in response to a command received by the controller 52. The store operation with respect to the first non-volatile memory cell 62A includes an erase phase and a program phase. During the erase phase, the controller 52 places the first non-volatile memory cell 62A in a known state so that it can be subsequently programmed to reflect the state of the bit of data on the bit line (bl). At the start of the erase phase, the controller 52 places: (1) $V_{STR}$ in a LOW condition to turn OFF the first switching device 64 and thereby disconnect the bit line (bl) from the stack 54; (2) $V_{RCL}$ in a LOW condition to turn OFF the second switching device 66 and thereby disconnect the stack 54 from ground 60; and (3) $V_{SE2}$ at the ground voltage, i.e., 0 volts. As a consequence, the first non-volatile memory cell 62A is isolated. The controller 52 also places: (1) $V_{SE1}$ in a LOW condition to put the gate of the first non-volatile memory cell 62A in a neutral position; and (2) the bit line in a HIGH condition. Next, the controller 14 transitions the $V_{SE2}$ signal from ground to a large negative voltage (referred to as an erase voltage) to place the first non-volatile memory cell 62A in a known condition. Specifically, after application of the erase voltage, the first non-volatile memory cell 62A has a known depletion threshold voltage, e.g., −2 V. The depletion threshold voltage is representative of a logical 0. At the end of the erase phase, the controller 52 causes the $V_{SE2}$ signal to transition from the large negative voltage to ground. The erase phase takes approximately 6–8 ms to complete.

With continued reference to FIG. 3, the program phase of the store operation causes the thresholds of the first non-volatile memory cell 62A to be set in a manner that reflects the value of the bit or signal present on the bit line (bl). The program operation commences with the controller establishing: (1) $V_{STR}$ in a HIGH condition to connect the bit line (bl) to the stack 54; (2) $V_{RCL}$ in the LOW condition to disconnect the stack 54 from ground 60; and (3) $V_{SE2}$ in the LOW condition to place the second non-volatile memory cell gate in a neutral position. The bit line (bl) is placed in a LOW condition, which reflects that the state of the bit that is to be programmed into the first non-volatile memory cell 62A is a logical 1 (if the bit was a logical 0, the bit line would be in a HIGH condition). The controller 52 cycles the $V_{SE2}$ between ground and a large positive voltage whose magnitude is greater than the power supply voltage (referred to as a program voltage) to establish a new threshold voltage, e.g., +2V. More specifically, the threshold of the first non-volatile memory cell 62A is changed or "programmed" and the threshold of the second non-volatile memory cell 62B is left unchanged or "program inhibited." At the end of the program phase, the controller 52 causes: (1) $V_{SE2}$ to transition from the program voltage to ground; and (2) $V_{STR}$ to transition from the HIGH state to the LOW state to disconnect the stack 54 from the bit line (bl). The program phase takes approximately 1.5–2 ms to complete. Note that the bit line read and write voltages are complimentary, i.e., a logical 0 is high during a write and low during a read. They can be made the same polarity by connecting the second end 58 to the positive power supply.

The programming phase implements a program with respect to the first non-volatile memory cell 62A and a dynamic program inhibit on the second non-volatile memory cell 62B, which is not being programmed. In the case of the store operation with respect to the first non-volatile memory cell 62A, the second non-volatile memory cell 626 is subjected to dynamic program inhibit. More specifically, because the second non-volatile memory cell 62B and the second switching device 66 are each cut-off, no charge can be supplied to the second non-volatile memory cell 62B. As such, the surface potential directly beneath the grounded gate of the second non-volatile memory cell 62B is close to the gate which is held at ground so that there is little or no voltage drop across the gate dielectric and, as a consequence, no tunneling of charge to change the threshold voltage. In contrast, for the first non-volatile memory cell 62A whose threshold is programmed, charge is available from the bit line. As a consequence, the surface potential of the first non-volatile memory cell 62A is at ground, the programming voltage on $V_{SE1}$ drops across the gate of the cell, and tunneling occurs across the ultra-thin oxide of the SNOS FET which leaves the nitride with a negative charge and the SNOS with a new threshold, e.g., +2V.

If the bit was a logical 0, there would have been no need to change the threshold in the first non-volatile memory cell 62A during programming. Consequently, dynamic program inhibit would have been used to prevent the first non-volatile memory cell 62A from being programmed, as well as the second non-volatile memory cell 62B.

With continuing reference to FIG. 3, the store operation with respect to the second non-volatile memory cell 62B has both an erase phase and program phase, just as with the store operation for the first non-volatile memory cell 62A. Further, the controller 52 manages $V_{STR}$ and $V_{RCL}$ during the erase and program phases in the same manner as noted with respect to store operation for the first non-volatile memory cell 62A. However, for the store operation with respect to the second non-volatile memory cell 62B, the controller 52 manages the $V_{SE2}$ and the $V_{SE1}$ signals differently. More specifically, for the duration of the erase phase, the controller 14 places $V_{SE1}$ in a LOW condition to place the gate of the first non-volatile memory cell 62A in a neutral position. At the beginning of the erase phase, the controller 52 establishes $V_{SE2}$ at ground. Subsequently, the controller 52 causes $V_{SE2}$ to transition from ground to a large negative voltage to establish the depletion threshold for the second non-volatile memory cell 62B. Finally, at the end of the erase phase, the controller causes $V_{SE2}$ to return to ground.

In the program phase, the controller 52 places $V_{SE1}$ in a HIGH condition to establish a connection between the bit line (bl) and the second non-volatile memory cell 62B. In this case, the bit line (bl) is placed in a HIGH condition, which reflects that the state of the bit that is to be programmed into the first non-volatile memory cell 62A is a logical 0. The value of the bit could also be a logical 1. In which case, the bit line would be in a LOW condition. However, because the bit line is in a HIGH condition, representing a logical 0, the threshold voltage of for the second non-volatile memory cell 62B will not change from the erase phase (if the bit was a logical 1, the bit line would be in a HIGH condition). To prevent the threshold from changing, dynamic program inhibit is utilized. In this case, with the bit line and $V_{STR}$ both in the HIGH condition, the drain of the first non-volatile memory cell 62A will rise to about 2V and the first non-volatile memory cell 62A will be cut-off by first switching device 64 whose gate and drain are both in the HIGH condition and therefore, unable to provide any charge. With all source of charge cut-off, $V_{SE2}$ will couple to the surface directly beneath it as it rises up to the program voltage. With essentially no voltage across the dielectric of the second non-volatile memory cell 62B, tunneling of charge is inhibited and the threshold voltage remains unchanged. In this case, dynamic program inhibit also prevent the first non-volatile memory cell from being programmed.

If the bit was a logical 1, there would have been a need to change the threshold in the second non-volatile memory cell 62B. In this case, programming would have proceeded as described with respect to the first non-volatile memory cell 62A and dynamic program inhibit would have been used to prevent the second non-volatile memory cell 62A from being programmed.

The use of dynamic program inhibit during the store operations associated with the first non-volatile memory cell 62A and the second non-volatile memory cell 62B has a number of advantages. Specifically, dynamic program inhibit reduces the number of nodes within an EEPROM to which a high voltage must be applied during store operation relative to, for example, a static program inhibit. This, in turn, allows the elements of an EEPROM to be positioned closer to one another, thereby increasing the number of EEPROM memory cells that can established in a given area of an integrated circuit. Further, the use of dynamic program inhibit in the store operations associated with both the first non-volatile memory cell 62A and the second non-volatile memory cell 62B permits the non-volatile memory cells to be randomly programmed, i.e., programmed in any order, because the high voltages are confined to the gates of the SNOS FETs and the underlying surfaces.

With continuing reference to FIG. 3, the read operation with respect to the first non-volatile memory cell 62A is described. The read operation typically occurs in response to a command received by the controller 52. At the beginning of the read operation, the controller 52 establishes each of $V_{STR}$, $V_{RCL}$, $V_{SE1}$ and $V_{SE2}$ in a LOW condition. The bit line is in a HIGH condition. Subsequently, the controller 52 places $V_{STR}$, $V_{RCL}$ and $V_{SE2}$ is a HIGH condition. The bit line (bl) does not discharge through the stack 54 because the first non-volatile memory cell 62A gated by 0 V sinks essentially no current because it was last programmed into enhancement mode. Since the sense amplifier at the end of the bit line (bl) does not perceive any change in the state of the signal on the bit line, it interprets the signal on the bit line as a logical "1".

With continuing reference to FIG. 3, the read operation with respect to the second non-volatile memory cell 62B is described. The controller 52 manages the state $V_{STR}$ and $V_{RCL}$ in the same manner as noted with respect to the first non-volatile memory cell 62A. However, the controller 52 manages the $V_{SE1}$ and $V_{SE2}$ signals differently. Specifically, the controller 52 places $V_{SE1}$ in a LOW condition at the beginning of the read operation and then causes $V_{SE1}$ to transition to a HIGH condition. The controller 52 places $V_{SE2}$ in a LOW condition for the duration of the read operation. The bit line (bl) is initially in a HIGH condition. However, since the second non-volatile memory cell 62B is a depletion type transistor gated by 0V, the stack 54 sinks current. As a consequence, the signal on the bit line dips, which is interpreted by sense amplifier as a logical "0."

It should be appreciated that the read operations with respect to the first non-volatile memory cell 62A and second non-volatile memory cell 62B can occur in any order, i.e., in a random order.

A number of modifications are possible. For instance, while the controller is depicted as being integrated onto the same chip as the nvSRAM cell or cells, the controller can also be implemented separately from the nvSRAM cells. Further, the controller and/or the memory cell can be integrated onto a chip that includes other componentry, such as logic circuits and microcontrollers.

The foregoing description of the invention has been presented for purposes of illustration and description. Further, the description is not intended to limit the invention to the form disclosed herein. Consequently, variations and modification commensurate with the above teachings, and the skill or knowledge in the relevant art are within the scope of the present invention. The embodiment described hereinabove is further intended to explain the best mode known of practicing the invention and to enable others skilled in the art to utilize the invention required by their particular applications or uses of the invention. It is intended that the appended claims be construed to include alternate embodiments to the extent permitted by the prior art.

What is claimed is:

1. A NAND stack electrically erasable programmable read-only memory device (EEPROM) comprising:

a bit line for transferring a bit of data to and from an exterior environment;

a ground line;

a NAND stack having a first end that is operatively connected to said bit line, a second end that is operatively connected to said ground line, a plurality of series-connected non-volatile memory cells located between said first end and said second end; and a controller having an interface for communicating with said plurality of series-connected non-volatile memory cells and capable of issuing signals to said plurality of series-connected non-volatile memory cells to cause said plurality of series-connected non-volatile memory cells to be programmed with bits of data in any order;

wherein said controller is capable of issuing signals that have a program voltage level which is suitable for programming the threshold level of each one of said plurality of series-connected non-volatile memory cells, wherein said controller, when in operation, only issues signals having said program voltage level to one of said plurality of series connected non-volatile memory cells at a time.

2. The NAND stack EEPROM, as claimed in claim 1, wherein:

said controller is capable of issuing signals to said plurality of series-connected non-volatile memory cells so that one of said plurality of series-connected non-volatile memory cells is programmed with a bit of data while dynamically program inhibiting the programming of all of the other of said plurality of series-connected non-volatile memory cells.

3. The NAND stack EEPROM, as claimed in claim 1, wherein:

said NAND stack includes a transistor switch located between one of the following: (a) said first end and said plurality of series-connected non-volatile memory cells, and (b) said second end and said plurality of series-connected non-volatile memory cells.

4. The NAND stack EEPROM, as claimed in claim 3, wherein:

said controller is capable of issuing signals that have a program voltage level which is suitable for programming the threshold level of each one of said plurality of series-connected non-volatile memory cells, wherein said controller, when in operation, only issues signals having said program voltage level to said series connected non-volatile memory cells and not to said transistor.

5. The NAND stack EEPROM, as claimed in claim 1, wherein:

said controller is capable of issuing signals to said plurality of series-connected non-volatile memory cells to cause bits of data previously programmed into said plurality of series-connected non-volatile memory cells to be read in any order.

* * * * *

UNITED STATES PATENT AND TRADEMARK OFFICE
CERTIFICATE OF CORRECTION

PATENT NO. : 6,512,694 B2
DATED : January 28, 2003
INVENTOR(S) : Christian E. Herdt It is certified that error appears in the above-identified patent and that said Letters Patent is hereby corrected as shown below:

Title page,
Item [56], OTHER PUBLICATIONS, delete "nySRAM", and insert
-- nvSRAM --; and Column 5,
Line 21, delete "626", and insert -- 62B --.

Signed and Sealed this

Fifteenth Day of July, 2003

JAMES E. ROGAN
*Director of the United States Patent and Trademark Office*